(12) United States Patent
Hagi et al.

(10) Patent No.: US 6,402,838 B1
(45) Date of Patent: Jun. 11, 2002

(54) CRYSTAL GROWTH VESSEL AND CRYSTAL GROWTH METHOD

(75) Inventors: Yoshiaki Hagi, Itami; Shigeto Kato, Yokohama, both of (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/629,153

(22) Filed: Jul. 31, 2000

(30) Foreign Application Priority Data

Aug. 2, 1999 (JP) .............................. 11-218709

(51) Int. Cl.$^7$ .............................................. C30B 35/00
(52) U.S. Cl. ........................... 117/204; 117/81; 117/83; 117/200; 117/900
(58) Field of Search ............................ 117/81, 83, 200, 117/204, 900

(56) References Cited

U.S. PATENT DOCUMENTS

| 1,793,672 A | 2/1931 | Bridgman |
| 3,335,035 A | 8/1967 | Marshall et al. |
| 6,139,631 A | * 10/2000 | Kato ........................ 117/200 |

FOREIGN PATENT DOCUMENTS

| DE | 19734736 | 2/1998 |
| JP | 57031157 | 2/1982 |
| JP | 57059782 | 4/1982 |
| JP | 6-1136987 | 6/1986 |
| JP | 61-261287 | 11/1986 |
| JP | 1-62363 | 4/1989 |
| JP | 6-298588 | 10/1994 |
| JP | 7-68075 | 7/1995 |
| JP | 07169739 | 7/1995 |
| JP | 08164810 | 6/1996 |
| JP | 9-221377 | 8/1997 |

OTHER PUBLICATIONS

A. J. Marshall, et al., "Growth of InP Crystals by the Synthesis, Solute Diffusion Method," Journal of Crystal Growth, vol. 44 (1978), pp. 651–652.

European Search Report of counterpart application No. EP 00 11 6640, dated Nov. 22, 2000.

* cited by examiner

Primary Examiner—Felisa Hiteshew
(74) Attorney, Agent, or Firm—Smith, Gambrell & Russell, LLP (57) ABSTRACT

A crystal growth vessel for growing a crystal within a main container has a crystal growth starting portion in which the crystal starts to grow, whereas the crystal growth starting portion is formed from a material having a thermal conductivity higher than that of a material of the main container.

4 Claims, 5 Drawing Sheets

CRYSTAL GROWTH VESSEL AND CRYSTAL GROWTH METHOD

BACKGROUND OF THE INVENTION

1. Field of the Invention

The present invention relates to a crystal growth vessel and crystal growth method for growing crystals of compound semiconductors such as GaAs and InP used in microwave devices and the like.

2. Related Background Art

Bridgeman method has conventionally been known as a technique for growing crystals of compound semiconductors and the like. In the Bridgeman method, there is a process which does not employ seed crystals, in order to grow a large amount of crystals inexpensively. More specifically, this process comprises the steps of combining Ga and As within a growth vessel not provided with seed crystals so as to generate a GaAs melt and then rapidly lowering the temperature of the growth vessel from its side where the growth is to be started (e.g., at the bottom part of the growth vessel), so as to grow crystals toward the other side (e.g., the opening part of the growth vessel). Though impurities usually accumulate in the finally grown area of generated crystals, they can be kept at an end part of crystals when the crystals are unidirectionally grown from the bottom part of the growth vessel toward the opening part as such, for example. When the end part where the crystals have finished growing is cut off, then crystals free of impurities can be obtained.

SUMMARY OF THE INVENTION

In the conventional technique in which crystals are grown with a temperature gradient without using seed crystals, however, there have been problems as follows. Namely, in the above-mentioned conventional technique, since no seed crystals are installed within the growth vessel, nuclei are hard to generate, so that the material melt would not solidify until the degree of supercooling enhances to a certain extent. If the temperature of the growth vessel is kept lowering, a large amount of melt which has not solidified although the temperature was lowered to its melting point or lower rapidly solidifies at the instant when a certain degree of supercooling is exceeded. As a result, there have been problems in the generated crystals, such as occurrences of so-called compositional misalignment, in which Ga and As are not combined one to one, and voids. Since polycrystals which have generated voids or compositional misalignment allow impurities to mix therein at the time of processing, they have to be discarded, which lowers the yield. On the other hand, there is an idea of slowing the cooling rate of the growth vessel in order to restrain the solution from rapidly solidifying, which lowers the productivity of crystals, however.

Also, since no seed crystals are disposed within the growth vessel, crystals do not always start growing from desirable places, so that there are cases where the material melt starts solidifying at a plurality of unexpected sites within the growth vessel. In such cases, the crystal growth does not always terminate at the end part of crystals, whereby there is a possibility of impurities accumulating at the center part of crystals. If impurities accumulate at the center part of crystals, then the yield becomes lower.

In view of such circumstances, it is an object of the present invention to provide a crystal growth vessel and crystal growth method which can unidirectionally grow high-quality crystals from a desirable site within the growth vessel at a low cost without lowering the cooling rate.

The present invention provides a crystal growth vessel for growing a crystal within a main container, the crystal growth vessel having a crystal growth starting portion in which the crystal starts to grow, the crystal growth starting portion being formed from a material having a thermal conductivity higher than that of a material of the main container.

For growing a crystal by using the crystal growth vessel in accordance with the present invention, the main container is started to cool after a material melt for the crystal is introduced into the main container. Here, since the crystal growth starting portion has a thermal conductivity higher than that of the main container, the temperature of the crystal growth starting portion becomes lower than that of the main container surrounding it. Therefore, the material melt can start to solidify from the crystal growth starting portion, whereby crystals can easily be grown uniaxially. Upon growing crystals, the material melt is cooled in a direction away from the crystal growth starting portion, so as to be solidified. Hence, even if the cooling rate is similar to that in the case where crystals are grown by a conventional growth vessel not equipped with the crystal growth starting portion, the material melt will solidify in a shorter period of time since the temperature of the crystal growth starting portion is lower than that of the main container. Consequently, as compared with the case where crystals are grown by a conventional growth vessel not equipped with the crystal growth starting portion, the amount of rapidly solidifying material melt becomes lower, whereby occurrences of compositional misalignment and voids can be reduced. Also, since there is no need to use seed crystals, the cost can be suppressed.

In this case, it is preferred that the main container comprise pBN, whereas the crystal growth starting portion comprise SiC, SiN, carbon, or sapphire.

The present invention provides another crystal growth vessel for growing a crystal within a main container, the crystal growth vessel having a crystal growth starting portion in which the crystal starts to grow, the crystal growth starting portion being formed from a material which is more wettable than a material of the main container.

For growing a crystal by using the crystal growth vessel in accordance with the present invention, the main container is started to cool after a material melt for the crystal is introduced into the main container. Here, since the crystal growth starting portion is formed from a material which is more wettable than the main container, nuclei are more likely to be generated therein. Therefore, the material melt can start to solidify from the crystal growth starting portion, whereby crystals can easily be grown uniaxially. Also, since nuclei are more likely to be generated in the crystal growth starting portion, the degree of supercooling of the material melt in the vicinity of the crystal growth starting portion becomes lower. Consequently, as compared with the case where crystals are grown by a conventional growth vessel not equipped with the crystal growth starting portion, the amount of rapidly solidifying material melt becomes lower, whereby occurrences of compositional misalignment and voids can be reduced. Also, since there is no need to use seed crystals, the cost can be suppressed.

In this case, it is preferred that the main container comprise pBN, whereas the crystal growth starting portion comprise quartz, pBN having a surface rougher than the main container, pBN-coated carbon having a surface rougher than the main container, or cBN having a surface rougher than the main container.

The present invention provides a crystal growth method for growing a crystal within a main container without using a seed crystal, the method comprising the steps of installing within the main container a crystal growth starting member having a thermal conductivity higher than that of the main container, and then generating a material melt for the crystal within the main container.

In the crystal growth method in accordance with the present invention, a crystal growth starting member having a thermal conductivity higher than that of the main container is initially installed within the main container without accommodating a seed crystal therein. Subsequently, a material melt for the crystal is generated within the main container, and then the main container is started to cool. Here, since the crystal growth starting member has a thermal conductivity higher than that of the main container, its temperature becomes lower than that of the main container surrounding it. Consequently, the material melt can start to solidify from the crystal growth starting member, so that crystals can easily be grown unidirectionally. Upon growing crystals, the material melt is cooled in a direction away from the crystal growth starting member, so as to be solidified. Hence, even if the cooling rate is similar to that in the case where crystals are grown by a conventional growth vessel not equipped with the crystal growth starting member, the material melt will solidify in a shorter period of time since the temperature of the crystal growth starting member is lower than that of the main container. Consequently, as compared with the case where crystals are grown by a conventional growth method in which the crystal growth starting member is not installed within the main container, the amount of rapidly solidifying material melt becomes lower, whereby occurrences of compositional misalignment and voids can be reduced. Also, since there is no need to use seed crystals, the cost can be suppressed.

In this case, it is preferred that the main container comprise pBN, whereas the crystal growth starting member comprise SiC, SiN, carbon, or sapphire.

The present invention provides another crystal growth method for growing a crystal within a main container without using a seed crystal, the method comprising the steps of generating a material melt for the crystal within the main container, and then introducing into the main container a crystal growth starting member having a thermal conductivity higher than that of the main container.

In the crystal growth method in accordance with the present invention, a material melt for the crystal is initially generated within the main container without accommodating a seed crystal therein. Subsequently, a crystal growth starting member having a thermal conductivity higher than that of the main container is introduced into the main container, and then the main container is started to cool. Here, since the crystal growth starting member has a thermal conductivity higher than that of the main container, its temperature becomes lower than that of the main container surrounding it. Consequently, the material melt can start to solidify from the crystal growth starting member, so that crystals can easily be grown unidirectionally. Upon growing crystals, the material melt is cooled in a direction away from the crystal growth starting member, so as to be solidified. Hence, even if the cooling rate is similar to that in the case where crystals are grown by a conventional growth vessel not equipped with the crystal growth starting member, the material melt will solidify in a shorter period of time since the temperature of the crystal growth starting member is lower than that of the main container. Consequently, as compared with the case where crystals are grown by a conventional growth method in which the crystal growth starting member is not introduced into the main container, the amount of rapidly solidifying material melt becomes lower, whereby occurrences of compositional misalignment and voids can be reduced. Also, since there is no need to use seed crystals, the cost can be suppressed.

In this case, it is preferred that the main container comprise pBN, whereas the crystal growth starting member comprise SiC, SiN, carbon, or sapphire.

The present invention provides still another crystal growth method for growing a crystal within a main container without using a seed crystal, the method comprising the steps of installing within the main container a crystal growth starting member which is more wettable than the main container, and then generating a material melt for the crystal within the main container.

In the crystal growth method in accordance with the present invention, a crystal growth starting member which is more wettable than the main container is initially installed within the main container without accommodating a seed crystal therein. Subsequently, a material melt for the crystal is generated within the main container, and then the main container is started to cool. Here, since the crystal growth starting member is formed from a material which is more wettable than the main container, nuclei are more likely to be generated therein. Therefore, the material melt can start to solidify from the crystal growth starting member, whereby crystals can easily be grown uniaxially. Also, since nuclei are more likely to be generated in the crystal growth starting member, the degree of supercooling of the material melt in the vicinity of the crystal growth starting member becomes lower. Consequently, as compared with the case where crystals are grown by a conventional growth method not installing the crystal growth starting member, the amount of rapidly solidifying material melt becomes lower, whereby occurrences of compositional misalignment and voids can be reduced. Also, since there is no need to use seed crystals, the cost can be suppressed.

In this case, it is preferred that the main container comprise pBN, whereas the crystal growth starting member comprise quartz, pBN having a surface rougher than the main container, pBN-coated carbon having a surface rougher than the main container, or cBN having a surface rougher than the main container.

The present invention provides another crystal growth method for growing a crystal within a main container without using a seed crystal, the method comprising the steps of generating a material melt for the crystal within the main container, and then introducing into the main container a crystal growth starting member which is more wettable than the main container.

In the crystal growth method in accordance with the present invention, a material melt for the crystal is initially generated within the main container without accommodating a seed crystal therein. Subsequently, a crystal growth starting member which is more wettable than the main container is introduced into the main container, and then the main container is started to cool. Here, since the crystal growth starting member is formed from a material which is more wettable than the main container, nuclei are more likely to be generated therein. Therefore, the material melt can start to solidify from the crystal growth starting member, whereby crystals can easily be grown uniaxially. Also, since nuclei are more likely to be generated in the crystal growth starting member, the degree of supercooling of the material melt in the vicinity of the crystal growth starting portion becomes lower. Consequently, as compared with the case where crystals are grown by a conventional growth method not installing the crystal growth starting member within the main container, the amount of rapidly solidifying material melt becomes lower, whereby occurrences of compositional misalignment and voids can be reduced. Also, since there is no need to use seed crystals, the cost can be suppressed.

In this case, it is preferred that the main container comprise pBN, whereas the crystal growth starting member comprise quartz, pBN having a surface rougher than the main container, pBN-coated carbon having a surface rougher than the main container, or cBN having a surface rougher than the main container.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In the following, preferred embodiments of the crystal growth vessel and crystal growth method in accordance with the present invention will be explained in detail with reference to the accompanying drawings. Here, constituents identical to each other will be referred to with numerals identical to each other without repeating their overlapping explanations.

FIRST EMBODIMENT

Figure 1:
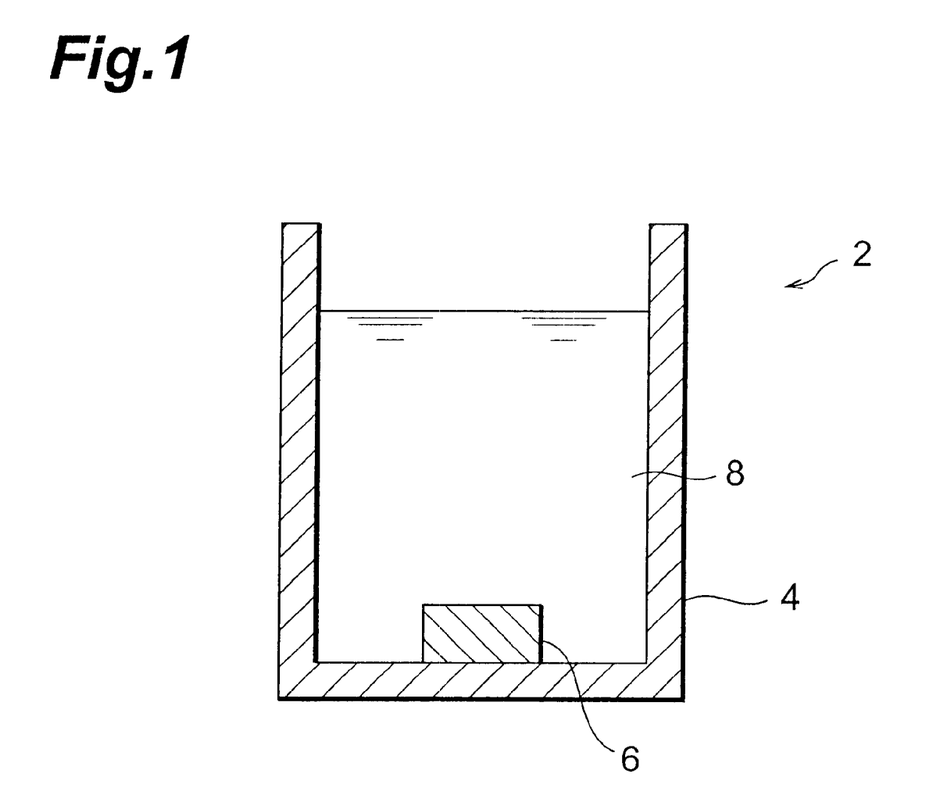
FIG. 1 is a view showing a first embodiment of the crystal growth vessel in accordance with the present invention.

FIG. 1 is a view showing a first embodiment of the crystal growth vessel in accordance with the present invention. As shown in this drawing, the crystal growth vessel 2 of this embodiment has a bottomed cylindrical main container 4 made of pBN (pyrolytic boron nitride), and a crystal growth starting portion 6 secured to the bottom part of the main container 4. The crystal growth starting portion 6 is shaped like a cylindrical column and is formed from SiC.

The thermal conductivity of pBN forming the main container 4 in the C-axis direction is 0.008 (cal/cm·s·K), whereas the thermal conductivity of SiC forming the crystal growth starting portion 6 is 0.23 (cal/cm·s·K). Namely, a material having a thermal conductivity higher than that of the main container 4 is used in the crystal growth starting portion 6.

A method of growing GaAs by using thus configured crystal growth vessel 2 will now be explained.

First, as shown in FIG. 1, a material melt 8 of GaAs is generated within the main container 4. Subsequently, the material melt 8 is started to cool from the bottom part of the main container 4 toward the upper part thereof. Specific cooling methods include a method in which the output of a heat source is lowered from the bottom part of the main container 4 toward the upper part thereof, and a known method in which the crystal growth vessel 2 is moved within a heating area generated by a heat source having a temperature profile in which temperature unidirectionally lowers.

When GaAs is grown by use of the crystal growth vessel 2 of this embodiment, the following effects are obtained. Namely, since the crystal growth starting portion 6 has a thermal conductivity higher than that of the main container 4 as mentioned above, the material melt 8 in the vicinity of the crystal growth starting portion 6 has a temperature lower than that of the material melt 8 in the vicinity of the main container 4. Therefore, the material melt 8 can start to solidify from the vicinity of the crystal growth starting portion 6, whereby crystals of GaAs can easily be grown unidirectionally (from the bottom part of the main container 4 to the upper part).

Upon growing the crystals, the material melt 8 is cooled from the bottom part of the main container 4 toward the upper part thereof, so as to be solidified. Hence, even if the cooling rate is similar to that in the case where crystals are grown by a conventional growth vessel not equipped with the crystal growth starting portion 6, the material melt 8 will solidify in a shorter period of time since the temperature of the crystal growth starting portion 6 is lower than that of the main container 4. Namely, the degree of supercooling decreases. Consequently, as compared with the case where crystals are grown by the conventional growth vessel, the amount of rapidly solidifying material melt 8 becomes lower, whereby occurrences of compositional misalignment and voids can be reduced without lowering the cooling rate. Also, since there is no need to use seed crystals when the crystal growth container 2 of this embodiment is used, the cost can be suppressed.

Though the crystal growth starting portion 6 is formed from SiC in this embodiment, it may also be formed from SiN (0.04 cal/cm·s·K), carbon (0.16 cal/cm·s·K), sapphire (0.07 cal/cm·s·K), or the like having a thermal conductivity higher than that of pBN forming the main container 4. Here, the main container 4 may be formed from a material other than pBN as well. If the crystal growth starting member 6 is formed from a material having a thermal conductivity higher than that of the main container 4, then the above-mentioned effects can also be obtained in this case.

Figure 2A:
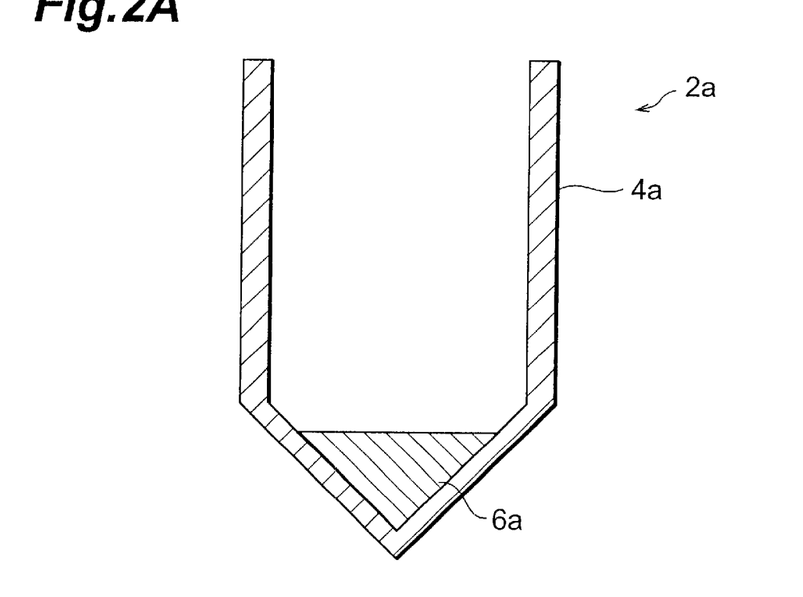
FIG. 2A is a view showing a modified example of the crystal growth vessel in accordance with the first embodiment.
Figure 2B:
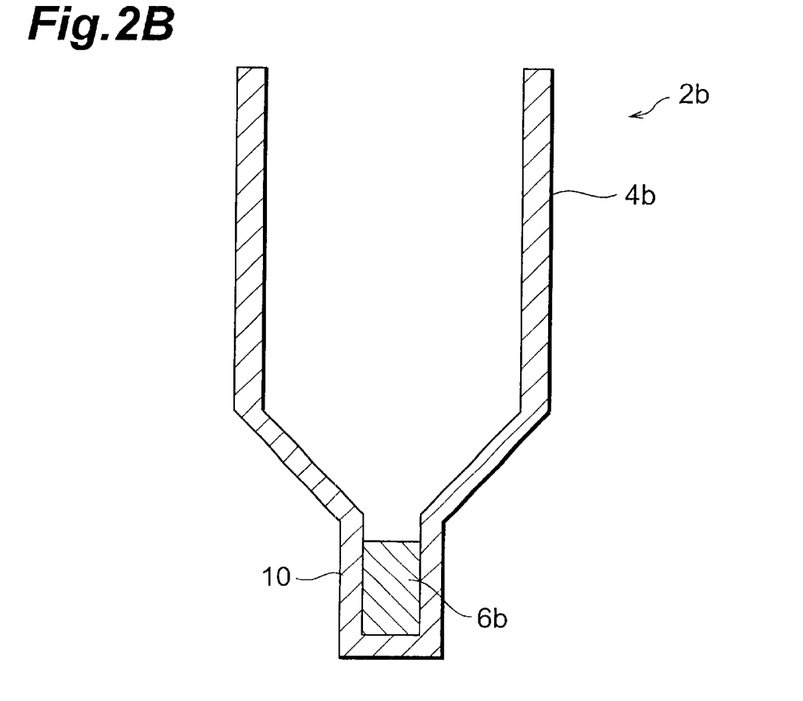
FIG. 2B is a view showing another modified example of the crystal growth vessel in accordance with the first embodiment.

In place of the crystal growth vessel 2 shown in FIG. 1, crystal growth vessels 2a, 2b shown in FIGS. 2A and 2B may also be used. The main container 4a of the crystal growth vessel 2a shown in FIG. 2A has a bottom part shaped like a cone, into which a conical crystal growth starting portion 6a is fitted. The main container 4b of the crystal growth vessel 2b shown in FIG. 2B has a bottom part formed with a thin tubular portion 10 for accommodating a crystal growth starting portion 6b. Effects similar to those in the embodiment can also be obtained when the crystal growth vessels 2a, 2b are used.

Figure 3:
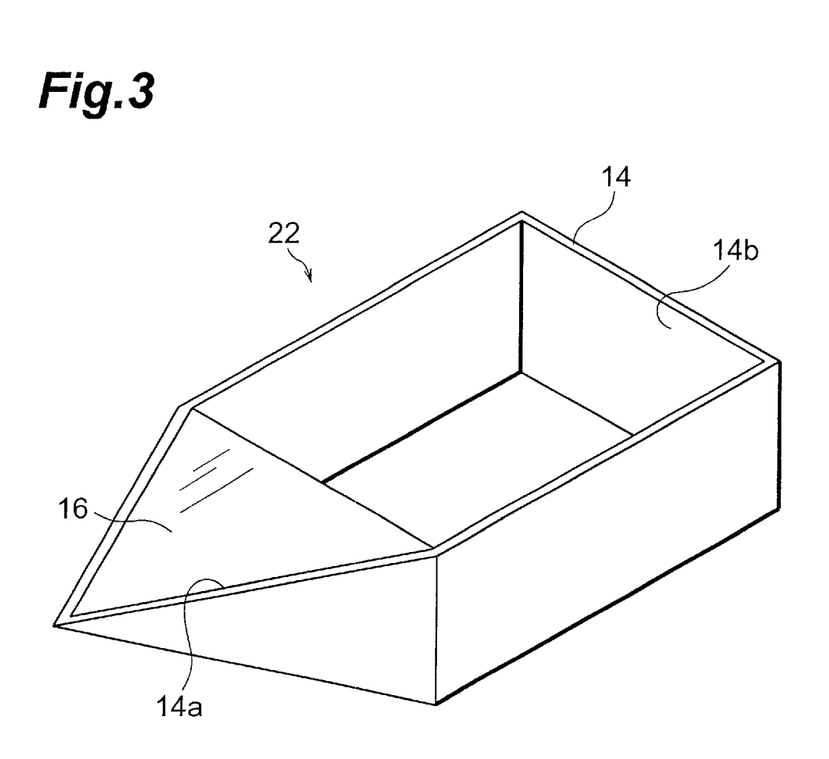
FIG. 3 is a view showing still another modified example of the crystal growth vessel in accordance with the first embodiment.

If a crystal growth vessel 22 having a crystal growth starting portion 16 disposed at a tip portion 14a of a boat-shaped main container 14, such as the one shown in FIG. 3, is used, then crystals of GaAs and the like can be grown laterally, more specifically from the tip portion 14a of the main container 14 toward the rear end 14b thereof.

Also, though a crystal growth vessel in which the crystal growth starting portion 6 is secured to the bottom part of the main container 4 is used in the crystal growth method of this embodiment, the following two methods using a crystal growth vessel to which the crystal growth starting portion 6 is unfixed may also be employed.

A first method comprises the steps of putting a crystal growth starting member made of SiC into a main container to which the crystal growth starting portion 6 is unfixed, then generating a material melt of GaAs within the main container, and cooling and solidifying GaAs. The crystal growth starting member in this method plays a role similar to that of the crystal growth starting portion 6 shown in FIG. 1, whereby the above-mentioned effects can also be obtained. Here, the crystal growth starting member may be shaped like a cylindrical column as in the crystal growth starting portion 6 shown in FIG. 1 or may have various other forms.

Figure 4A:
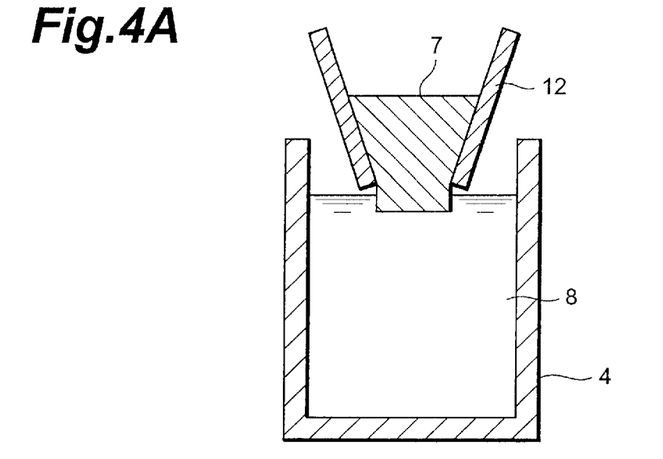
FIGS. 4A to 4C are views specifically showing respective states in which the crystal growth method of the present invention is employed.
Figure 4B:
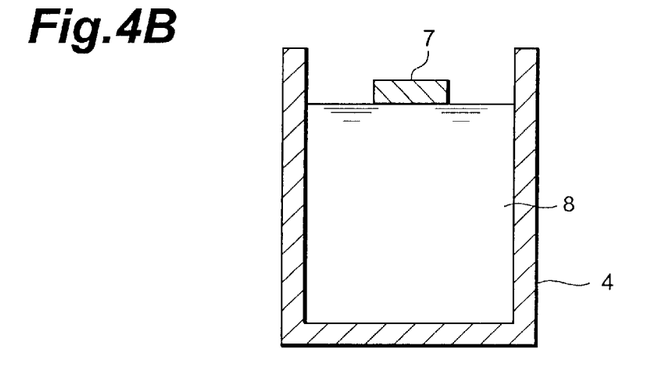
Figure 4C:
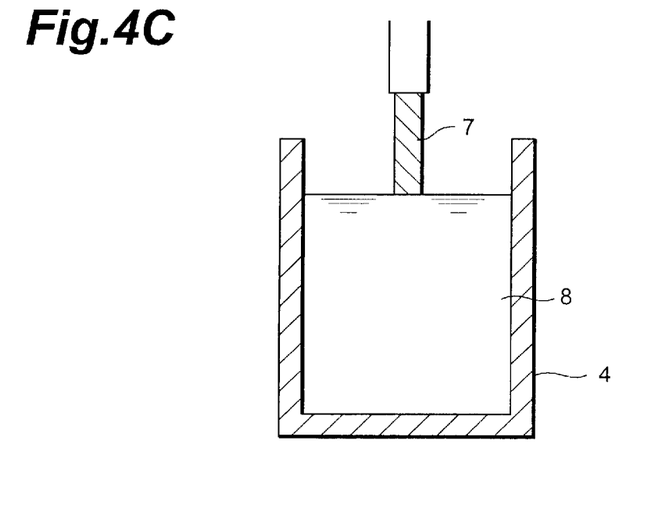

A second method comprises the steps of generating a material melt of GaAs within a main container, then introducing a crystal growth starting member made of SiC into the main container, and bringing this crystal growth starting member into contact with the material melt of GaAs. Specific examples of the second method are shown in FIGS. 4A to 4C. In the method shown in FIG. 4A, the material melt 8 is introduced into the main container 4, and then a tapered support member 12 into which a crystal growth starting member 7 is fitted is set above the main container 4. In the method shown in FIG. 4B, a crystal growth starting member 7 shaped like a cylindrical column is floated on the liquid surface of the material melt 8 introduced into the main container 4. In the method shown in FIG. 4C, a rod-shaped crystal growth starting member 7 is immersed into the material melt 8 generated in the main container 4. In these methods, the crystal growth starting member 7 plays a role similar to that of the crystal growth starting portion 6 shown in FIG. 1, whereby the above-mentioned effects can be obtained. In the cases where the methods shown in FIGS. 4A to 4C are employed, GaAs would be cooled from the upper side of the main container 4 toward the bottom part thereof, so as to be solidified.

Also, as with the crystal growth starting member 6, the crystal growth starting member in the first and second methods may be formed from SiN, carbon, sapphire, or the like which has a thermal conductivity higher than that of pBN forming the main container 4.

SECOND EMBODIMENT

Figure 5:
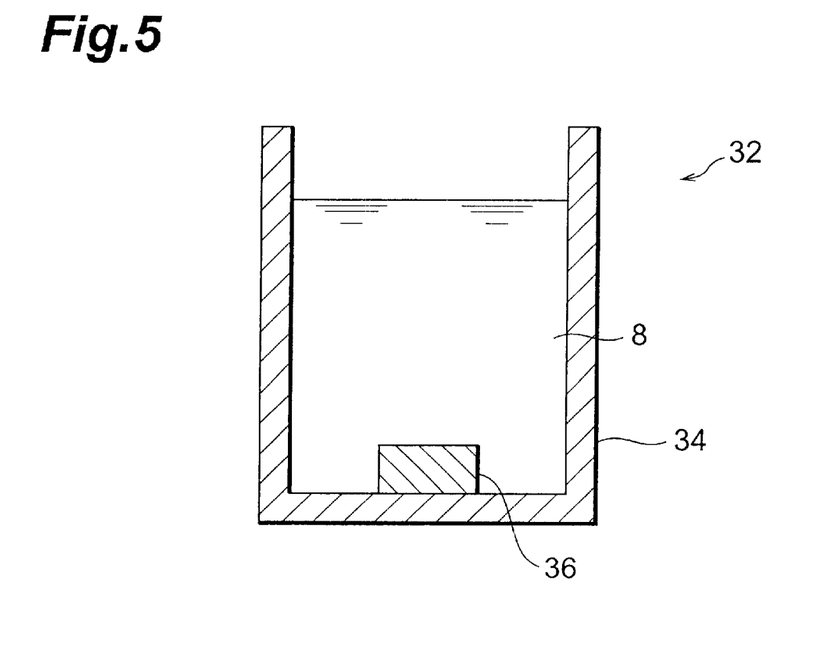
FIG. 5 is a view showing a second embodiment of the crystal growth vessel in accordance with the present invention.

FIG. 5 is a view showing a second embodiment of the crystal growth vessel in accordance with the present invention. As shown in this drawing, the crystal growth vessel 32 of this embodiment has a bottomed cylindrical main container 34 made of pBN (pyrolytic boron nitride), and a crystal growth starting portion 36 secured to the bottom part of the main container 34. The crystal growth starting portion 36 is shaped like a cylindrical column and is formed from quartz which has a wettablility higher than that of pBN.

A method of growing GaAs by using thus configured crystal growth vessel 32 will now be explained.

First, as shown in FIG. 5, a material melt 8 of GaAs is generated within the main container 34. Subsequently, the material melt 8 is started to cool from the bottom part of the main container 34 toward the upper part thereof. When GaAs is grown by use of the crystal growth vessel 32 of this embodiment, the following effects are obtained. Namely, since the crystal growth starting portion 36 has a wettability higher than that of the main container 34, the material melt 8 in the vicinity of the crystal growth starting portion 36 is more likely to generate nuclei than the material melt 8 in the vicinity of the main container 34 does. Therefore, the material melt 8 can start to solidify from the vicinity of the crystal growth starting portion 36, whereby crystals of GaAs can easily be grown unidirectionally (from the bottom part of the main container 34 to the upper part).

Upon growing the crystals, the material melt 8 is cooled from the bottom part of the main container 34 toward the upper part thereof, so as to be solidified. Hence, even if the cooling rate is similar to that in the case where crystals are grown by a conventional growth vessel not equipped with the crystal growth starting portion 36, the material melt 8 will solidify in a shorter period of time since nuclei are more likely to be generated in the vicinity of the crystal growth starting portion 36. Consequently, as compared with the case where crystals are grown by a conventional growth vessel not equipped with the crystal growth starting portion, the amount of rapidly solidifying material melt 8 becomes lower, whereby occurrences of compositional misalignment and voids can be reduced without lowering the cooling rate. Also, since there is no need to use seed crystals when the crystal growth container 32 of this embodiment is used, the cost can be suppressed.

Though the crystal growth starting portion 36 is formed from quartz in this embodiment, it may also be formed from a material having a wettability higher than that of the main container 34, such as pBN having a surface rougher than the main container 34, pBN-coated carbon having a surface rougher than the main container 34, or cBN having a surface rougher than the main container 34.

Figure 6:
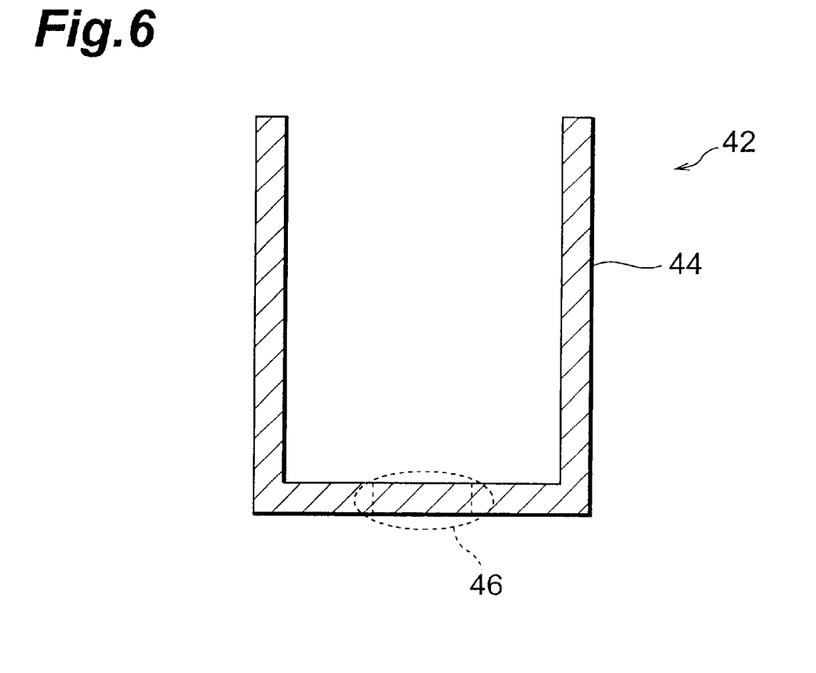
FIG. 6 is a view showing a modified example of the second embodiment of the crystal growth vessel in accordance with the present invention.

In place of the crystal growth vessel 32 shown in FIG. 5, a crystal growth vessel 42 shown in FIG. 6 may be used. In the crystal growth vessel 42, a crystal growth starting portion 46 is formed at the bottom part of a bottomed cylindrical main container 44. The crystal growth starting portion 46 has been subjected to grinding, so as to make a surface rougher than the other areas, thereby yielding a wettability higher than the other areas. As in the first embodiment, the main containers 4a, 4b shown in FIGS. 2A and 2B may be used. Further, if the crystal growth starting portion 36 is installed at the tip portion 14a of the boat-shaped main container 14, such as the one shown in FIG. 3, so as to grow crystals, then crystals of GaAs and the like can be grown laterally.

Also, though a crystal growth vessel in which the crystal growth starting portion 36 is secured to the bottom part of the main container 34 is used in the crystal growth method in accordance with this embodiment, the following two methods using a crystal growth vessel to which the crystal growth starting portion 36 is unfixed may also be employed as in the first embodiment.

A first method comprises the steps of putting a crystal growth starting member made of quartz into a main container to which the crystal growth starting portion 36 is unfixed, then generating a material melt of GaAs within the main container, and cooling and solidifying GaAs. The crystal growth starting member in this method plays a role similar to that of the crystal growth starting portion 36 shown in FIG. 5, whereby the above-mentioned effects can also be obtained.

A second method comprises the steps of generating a material melt 8 of GaAs within a main container, then introducing a crystal growth starting member 7 made of quartz into the main container, and bringing this crystal growth starting member 7 into contact with the material melt 8 of GaAs, as shown in FIGS. 4A to 4C. The crystal growth starting member 7 in this method plays a role similar to that of the crystal growth starting portion 36 shown in FIG. 5, whereby the above-mentioned effects can also be obtained. In the cases where the methods shown in FIGS. 4A to 4C are employed, GaAs would be cooled from the upper side of the main container toward the bottom part thereof, so as to be solidified.

Also, as with the crystal growth starting portion 36, the crystal growth starting member in the first and second methods may be formed from not only quartz, but also a material having a wettability higher than that of the main container 34, such as pBN having a surface rougher than the main container 34, pBN-coated carbon having a surface rougher than the main container 34, or cBN having a surface rougher than the main container 34.

EXAMPLES

Examples of the present invention will now be explained. Examples 1, 2 shown in Table 1 correspond to the above-mentioned first embodiment, and show their yields when crystals of GaAs were grown. In Examples 1 and 2, a crystal growth vessel 22 equipped with a boat-shaped main container 14 shown in FIG. 3 was used, while a crystal growth starting portion 16 made of carbon was installed at a tip portion 14a of the main container 14. The main container 14 made of pBN was used in Example 1, whereas the main container 14 made of quartz was used in Example 2. In each Example, in a heat environment with a temperature gradient of 10° C./cm, crystals of GaAs were grown under two kinds of moving rate conditions of 10 mm/h and 20 mm/h.

For comparison, crystals of GaAs were grown by use of a main container 14 in which no crystal growth starting portion 16 was installed (Comparative Example 1). When Examples 1, 2 and Comparative Example 1 are compared with each other, it can be seen that the yield was higher and compositional misalignment and voids were restrained from occurring in Examples 1, 2. In particular, the yield was higher in Examples 1, 2 even if the cooling rate was made higher. When Examples 1 and 2 are compared with each other, it can be seen that using the main container 14 made of pBN suppresses the compositional misalignment and the like more than using the main container 14 made of quartz does. Also, using the main container 14 made of pBN is advantageous in that the main container 14 can be used a plurality of times.

Examples 3 to 5 correspond to the above-mentioned second embodiment. In Examples 3 to 5, a crystal growth vessel 22 equipped with the main container 14 made of pBN shown in FIG. 3 was used, while a crystal growth starting portion 16 was installed or formed at a tip portion 14a of the main container 14. As the crystal growth starting portion 16, quartz whose surface had been roughened with #120 paper was installed in Example 3, a pBN plate having a surface rougher than the main container 14 was installed in Example 4, and the surface of the tip portion 14a of the main container 14 was roughened with #60 paper in Example 5. In each Example, in a heat environment with a temperature gradient of 10° C./cm, crystals of GaAs were grown under two kinds of moving rate conditions of 10 mm/h and 20 mm/h.

When Examples 3 to 5 and Comparative Example 1 are compared with each other, it can be seen that the yield was higher and compositional misalignment and voids were restrained from occurring in Examples 3 to 5. In particular, the yield was higher in Examples 3 to 5 even if the cooling rate was made higher.

In Examples 6, 7, crystals of GaAs were grown by the method shown in FIG. 4C, i.e., method in which a rod-like crystal growth starting member 7 was immersed into the material melt 8 generated within the main container 4. The crystal growth starting member 7 was made of SiC (corresponding to the first embodiment) in Example 6, and was made of quartz (corresponding to the second embodiment) in Example 7. In each Example, in a heat environment with a temperature gradient of 50° C./cm, crystals of GaAs were grown under two kinds of moving rate conditions of 10 mm/h and 20 mm/h. Here, while the crystal growth starting member 7 was in contact with the material melt 8, the main container 4 was moved within the heating area.

Also, for comparison, crystals of GaAs were grown by use of a main container 14 equipped with no crystal growth starting portion 16 (Comparative Example 2). When Examples 6, 7 and Comparative Example 2 are compared with each other, it can be seen that the yield was higher and compositional misalignment and voids were restrained from occurring in Examples 6, 7. In particular, the yield was higher in Examples 6, 7 even if the cooling rate was made higher.

TABLE 1

| | main container | crystal growth starting portion | yield 10 mm/H | yield 20 m/H |
|---|---|---|---|---|
| Example | pBN | carbon | 95~99% | 95~99% |
| Example | quartz | carbon | 91~99% | 93~99% |
| Example | pBN | quartz | 95~99% | 95~99% |
| Example | pBN | roughened pBN | 95~99% | 94~99% |
| Example | pBN | roughened surface | 93~98% | 90~96% |
| Example | pBN | SiC | 93~99% | 90~99% |
| Example | PBN | quartz | 95~99% | 92~98% |
| Comparative Example | pBN | — | 90~98% | 60~85% |
| Comparative Example | pBN | — | 85~97% | 60~75% |

Though the invention achieved by the inventor has specifically been explained in the foregoing with reference to the embodiments, it should not be restricted thereto. For example, not only GaAs but various crystals such as InP can be grown by the crystal growth vessels of the embodiments.

In the crystal growth vessel and crystal growth method of the present invention, as explained in the foregoing, high-quality crystals can be grown unidirectionally from a desirable site within the growth vessel at a low cost without lowering the cooling rate.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A crystal growth vessel for growing a crystal within a main container, said crystal growth vessel having a crystal growth starting portion in which said crystal starts to grow, said crystal growth starting portion being formed from a material having a thermal conductivity higher than that of a material of said main container.

2. A crystal growth vessel according to claim 1, wherein said main container comprises pBN; and wherein said crystal growth starting portion comprises SiC, SiN, carbon, or sapphire.

3. A crystal growth vessel for growing a crystal within a main container, said crystal growth vessel having a crystal growth starting portion in which said crystal starts to grow, said crystal growth starting portion being formed from a material which is more wettable than a material of said main container.

4. A crystal growth vessel according to claim 3, wherein said main container comprises pBN; and wherein said crystal growth starting portion comprises quartz, pBN having a surface rougher than said main container, pBN-coated carbon having a surface rougher than said main container, or cBN having a surface rougher than said main container.

* * * * *